(12) United States Patent  
Li et al.

(10) Patent No.: US 11,490,341 B2  
(45) Date of Patent: Nov. 1, 2022

(54) WIRELESS NODE FOR RECEIVING A WIRELESS SIGNAL AND METHOD THEREOF

(71) Applicant: Telefonaktiebolaget LM Ericsson (publ), Stockholm (SE)

(72) Inventors: Jingya Li, Gothenburg (SE); Gabor Fodor, Hässelby (SE); Ricardo Blasco Serrano, Espoo (FI); Shaohua Li, Kanata (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/965,080

(22) PCT Filed: Feb. 2, 2018

(86) PCT No.: PCT/SE2018/050089  
§ 371 (c)(1),  
(2) Date: Jul. 27, 2020

(87) PCT Pub. No.: WO2019/151915  
PCT Pub. Date: Aug. 8, 2019

(65) Prior Publication Data  
US 2021/0112505 A1    Apr. 15, 2021

(51) Int. Cl.  
*H04W 52/52* (2009.01)  
*H04W 4/40* (2018.01)  
(Continued)

(52) U.S. Cl.  
CPC ......... *H04W 52/52* (2013.01); *H04L 27/2607* (2013.01); *H04W 4/40* (2018.02); *H04W 72/005* (2013.01)

(58) Field of Classification Search  
None  
See application file for complete search history.

(56) References Cited

U.S. PATENT DOCUMENTS

2009/0053994 A1* 2/2009 Senarath ............... H04B 7/2606  
455/11.1  
2012/0281611 A1 11/2012 Zhang et al.  
(Continued)

FOREIGN PATENT DOCUMENTS

EP    2853121 A1    4/2015

OTHER PUBLICATIONS

PCT International Search Report and Written Opinion dated Oct. 12, 2018 for nternational Application PCT/SE2018/050089, 12 pages.  
(Continued)

*Primary Examiner* — Diane L Lo  
(74) *Attorney, Agent, or Firm* — Sage Patent Group

(57) ABSTRACT

A method for use in a wireless node configured to receive a wireless signal includes receiving, using a first set of physical resources, a first wireless signal including an indicator descriptive of a transmission power used by a second wireless node when transmitting the wireless signal on a second set of physical resources, and receiving, using the second set of physical resources, the wireless signal using an Automatic Gain Control, AGC, configuration, wherein the AGC configuration is determined based on the indicator. The disclosure further relates to a wireless node performing the method.

8 Claims, 10 Drawing Sheets

(51) Int. Cl.
 *H04L 27/26* (2006.01)
 *H04W 72/00* (2009.01)

(56) References Cited

U.S. PATENT DOCUMENTS

| | | | |
|---|---|---|---|
| 2013/0310103 A1* | 11/2013 | Madan | H04W 52/386 |
| | | | 455/522 |
| 2016/0174174 A1 | 6/2016 | Chae et al. | |
| 2017/0374539 A1 | 12/2017 | Chae et al. | |
| 2020/0007297 A1* | 1/2020 | Hong | H04W 4/40 |

OTHER PUBLICATIONS

LG Electronics, 3GPP TSG RAN WG1 Meeting #90 R1-1713091, "Discussion on Handling PC5 Operation with Short TTI", Prague Czechia, Aug. 21-25, 2017, 5 pages.
Extended European Search Report for European Patent Application No. 18903641.1 dated Aug. 19, 2021, 8 pages.
Intel Corporation, 3GPP TSG RAN1 WG Meeting #88bis, R1-1704688, "Consideration on Support of Short for TTI for LTE V2V Sidelink Communication" Spokane, USA, Apr. 3-7, 2017, 10 pages, XP051242827.

* cited by examiner

WIRELESS NODE FOR RECEIVING A WIRELESS SIGNAL AND METHOD THEREOF

CROSS-REFERENCE TO RELATED APPLICATIONS

This application is a 35 U.S.C. § 371 national stage application for International Application No. PCT/SE2018/050089, entitled "WIRELESS NODE FOR RECEIVING A WIRELESS SIGNAL AND METHOD THEREOF", filed on Feb. 2, 2018, the disclosure of which is hereby incorporated by reference in its entirety.

TECHNICAL FIELD

The present disclosure relates to a wireless node for receiving a wireless signal. Furthermore, the present disclosure also relates to corresponding, methods, computer programs, computer program products and carriers.

BACKGROUND

In wireless communication systems, information is transmitted wirelessly between the different wireless nodes of the system. For example, information may be transmitted downlink (DL), from a wireless node, such as a base station (BS), to another wireless node, such as a user equipment (UE), or, uplink (UL) from the UE to the BS. In the case of Device-to-device (D2D) communication, information may be transmitted from one transmitting node, such as a transmitting TX UE, to one or more receiving wireless nodes, such as a receiving RX UE. D2D communication between devices in the proximity of one another has been proposed to enhance the user data rates, increase the system capacity and reduce latency. For D2D communications various power control algorithms have been discussed, although these are not implemented in practice. Specifically in 3GPP systems, the sidelink (SL) enables D2D communications over resources that may be controlled by the BS. Due to the mobility patterns of D2D scenarios, and the fading channel characteristics between devices, the received power may vary at the Rx UE devices.

Specifically, in 3GPP LTE systems, SL communications are performed on a subframe or slot basis. In the PHY layer, the SL control information is transmitted over the physical sidelink control channel (PSCCH), and the SL data information is carried over the physical sidelink shared channel (PSSCH). The subframe structure for PSCCH and PSSCH is based on the cellular uplink transmission structure, more specifically, the basic structure of physical uplink shared channel (PUSCH). In 3GPP LTE Rel-12 and Rel-13, all SL communications are based on Discrete Fourier Transform Spread (DFTS)-OFDM with subcarrier spacing of 15 kHz and a subframe/slot structure. To cope with high UE mobility (and short channel coherence time) scenarios, in particular in Rel-14 intended for vehicle-to-vehicle (V2V) SL communication, the number of symbols used for the transmission of demodulation reference signals (DMRS) has been increased to four. The subframe/slot structure may comprise of 14 SC-FDMA symbols for PSSCH and PSCCH in LTE V2V sidelink. The last symbol of the subframe is typically not used for transmitting data. Instead, it is used as a guard period (GP), e.g. for switching between SL transmission and reception, as well as between SL transmission/reception and uplink transmission. An important difference from UL transmission, is that there can be multiple receiving, RX UE, wireless nodes involved in the SL communication. Consequently, SL transmissions may not be power controlled to any one RX UE. This can lead to significant received power variation from one time instant to another for a Rx node. Therefore, the first symbol (up to 70 us) of the subframe for SL communication is reserved or dedicated for use as an automatic gain controller (AGC) settling period at the Rx nodes.

In multipath fading channels, the dynamical range of the received power at receiving (Rx) wireless nodes may be large (e.g. >60 dB), which makes variable gain power amplifiers an important part of the Rx wireless node circuitry. A key component of variable gain amplifiers is Automatic Gain Control, AGC, which is designed to exhibit fast initial convergence and adaptive capabilities to maintain an acceptable link quality even in fast fading channels. This is essential for the correct data decoding at RX nodes. The required AGC settling time at an Rx node depends on many factors, e.g., the receiving power range for the data reception, the hardware of the RX node, the AGC implementation type, the convergence rate of the applied AGC algorithm, etc. To ensure sufficient time for AGC convergence, OFDM based systems may use the duration of a dedicated symbol ("AGC symbol"), e.g. in the beginning of a received data frame, slot or packet. Although this dedicated AGC symbol is useful for automatic gain control, it presents an overhead at the communication link that negatively impacts the overall spectral efficiency and user throughput.

The 3GPP New Radio (NR) system is designed to operate on a wide range of frequency channels, propagation conditions, and device capabilities. A key concept is the flexible numerology that allows UEs or wireless nodes to use different subcarrier spacing (SCS), waveform parameterization, cyclic prefix length, slot- and frame structure, depending on the deployment scenario and the carrier frequency. In the example of 3GPP NR, the default transmission unit length consists of 14 OFDM symbols with normal cyclic prefix. A numerology with a larger subcarrier spacing has a shorter transmission duration. Note that the NR frame structure or slot structure also supports the concept of mini-slots/non-slot based transmissions that contain a reduced number of OFDM symbols for a short transmission duration to facilitate ultra-low latency communications. As the transmission duration becomes shorter, 1 symbol duration with a reference numerology of 15 kHz, i.e., around 70 us fixed time duration, reserved for AGC settling can result in a large overhead. This negatively impacts the overall spectral efficiency and user throughput. In an example, a specific numerology (using 15 kHz or 30 kHz) is used for each OFDM symbol within a slot. As can be understood, a higher SCS reduces the OFDM symbol time for each symbol in the slot. The AGC overhead increases as the subcarrier spacing increases or/and the slot lengths decreases.

Normal OFDM/DFTS-OFDM symbols containing data may be transmitted in the first symbol used for AGC settling, and these data can be used for decoding at the RX UEs. However, a problem when doing so is that the data transmitted during the AGC settling period may be distorted, which can affect the overall data decoding performance, depending on a ratio between the AGC settling period to the overall transmission duration of a subframe, slot or mini-slot. For instance, if the data transmitted in the AGC symbol is lost at the RX UE, and the overall transmission duration consists of two symbols, then, it is high likely that the RX UE cannot decode the SL data since 50% of the data is lost due to the AGC impact/overhead. Therefore, the relative overhead of AGC settling duration has an impact on the SL communication performance, and the impact is higher for shorter SL transmission durations. Moreover, to enable early data decoding and low latency, or/and to enable different MIMO technologies used for PSCCH and PSSCH, it is possible that the PSCCH and its associated PSSCH are multiplexed in the same time slot with the same frequency allocation. If some control information is carried in the first AGC symbol, then, the AGC settling period can cause a reliability issue for the control channel, which can also result in a failure for the decoding of PSSCH.

The AGC settling time and the receiver dynamic range depend on a number of factors including the carrier frequency, the bandwidth of the carrier under consideration, the class of UE selected as well as the scenarios and use cases under consideration. Therefore, it is difficult and can be very suboptimal to set a single value of AGC settling time for all SL communication cases.

In one example of a unicast case, there is a single target RX node for the SL transmission and the TX node is typically aware of the capabilities of the RX node.

In a further example of a multicast case, there are multiple target RX nodes for the SL transmission, and each RX node may have different AGC settling capabilities as well as different receiving power ranges. To enable that the SL transmission reaches all RX nodes, the AGC settling duration is limited to the RX node in need of the longest AGC settling period. However, in the multicast case, the TX node is typically unaware of the capabilities of the RX nodes, which makes it even harder or not possible to acquire the AGC settling related information of all RX nodes.

Thus, different solutions need to be considered to mitigate or compensate the AGC settling effects on different SL communication cases.

Thus there is a need to provide a solution which mitigates or solves the described drawbacks and problems, such as to reduce overhead at the communication link that negatively impacts the overall spectral efficiency and user throughput.

SUMMARY

An objective of embodiments of the invention is to provide a solution which mitigates or solves the drawbacks and problems described above. The above and further objectives are achieved by the subject matter described herein. Further advantageous embodiments or implementation forms of the invention are also defined herein.

According to a first aspect of the invention, the above mentioned and other objectives are achieved with a method for use in a wireless node configured to receive a wireless signal, the method comprising receiving, using a first set of physical resources, a first wireless signal comprising an indicator descriptive of a transmission power used by a second wireless node when transmitting the wireless signal on a second set of physical resources, receiving, using the second set of physical resources, the wireless signal using an Automatic Gain Control, AGC, configuration, wherein the AGC configuration is determined based on the indicator.

At least an advantage of the invention according to the first aspect is to improve overall spectral efficiency and user data throughput by reducing AGC overhead.

According to a second aspect of the invention, the above mentioned and other objectives are achieved with a wireless node.

The advantages of the second aspect are the same as for the first aspect.

Further applications and advantages of embodiments of the invention will be apparent from the following detailed description.

Figure 1:
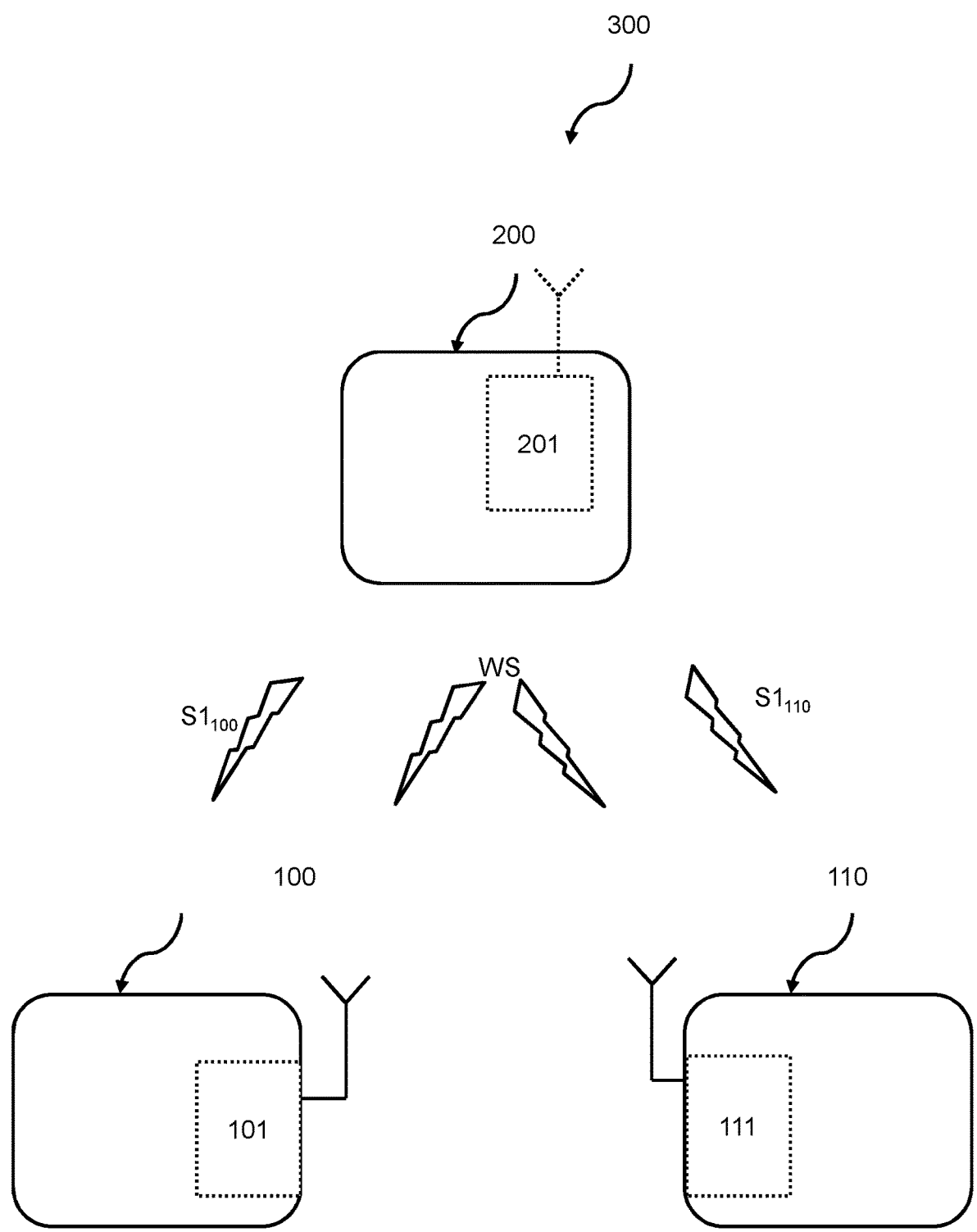
FIG. 1 shows a wireless communication system according to one or more embodiments of the present disclosure.

A more complete understanding of embodiments of the invention will be afforded to those skilled in the art, as well as a realization of additional advantages thereof, by a consideration of the following detailed description of one or more embodiments. It should be appreciated that like reference numerals are used to identify like elements illustrated in one or more of the figures.

DETAILED DESCRIPTION

In some embodiments herein, a term wireless node is used and it can correspond to any type of wireless node or wireless communication network node, which communicates with other wireless nodes, such as a user equipment, UE, a network node or any other wireless communications network node.

In some embodiments the non-limiting term user equipment (UE) is used interchangeably with wireless node and refers to any type of wireless node communicating with a network node or with another UE in a cellular, mobile communication system or wireless communication network. Examples of a UE are a target device, a device to device (D2D) UE, a machine type UE or a UE capable of machine to machine (M2M) communication, a PDA, a PAD, a Tablet, a mobile terminal, a smart phone, a laptop embedded equipped (LEE), a laptop mounted equipment (LME), a USB dongle, a ProSe UE, a V2V UE, a V2X UE, a MTC UE, a eMTC UE, a FeMTC UE, a UE Cat 0, a UE Cat M1, a narrow band Iot (NB-IoT) UE, a UE Cat NB1, etc.

In some embodiments herein a further term "network node" is used and it can correspond to any type of wireless node or wireless communication network node, which communicates with other wireless nodes, a network node or any other wireless communications network node. Examples of network nodes are Transmission/Reception Point TRP, NodeB, MeNB, SeNB, gNB, a network node belonging to MCG or SCG, base station (BS), multi-standard radio (MSR) radio node such as MSR BS, eNodeB, network controller, radio network controller (RNC), base station controller (BSC), relay, donor node controlling relay, base transceiver station (BTS), access point (AP), transmission points, transmission nodes, RRU, RRH, nodes in distributed antenna system (DAS), core network node (e.g. MSC, MME, etc.), O&M, OSS, SON, positioning node (e.g. E-SMLC), MDT, test equipment, etc. The expressions TRP and network node are used interchangeably in the present disclosure.

The embodiments herein are described for Long Term Evolution, LTE, based systems. However the embodiments are applicable to any RAT or multi-RAT systems, where the UE receives and/or transmit signals (e.g. data) e.g. LTE FDD/TDD, WCDMA/HSPA, GSM/GERAN, Wi Fi, WLAN, CDMA2000, 5G, NR/NX, etc.

The term signal or wireless signal used herein can be a physical signal or it can be a physical channel. A physical signal does not contain higher layer information whereas a physical channel contains higher layer information or data. Examples of physical signals are control signals or Reference Signals. Examples of physical channels are physical sidelink control channel, PSCCH, physical sidelink feedback channel, PSFCH and physical sidelink shared channel, PSSCH.

The term physical resource may comprise of a time resource and/or a frequency resource. The term time resource used herein may correspond to any type of physical resource or radio resource expressed in terms of length of time. Examples of time resources are: symbol, time slot, slot, mini-slot, sub frame, radio frame, TTI, interleaving time, special sub frame, UpPTS, short TTI (sTTI), short sub frame (SSF) etc. The term a frequency resource used herein may correspond to any type of physical resource or radio resource expressed in terms of frequency bandwidth. Examples of a physical resource are resource block (RB), physical RB (PRB), virtual RB (VRB), resource element (RE) etc.

The term "configured to" may be used interchangeably with "adapted to" or "operative to" in the disclosure herein.

The term "memory" may be used interchangeably with "computer readable medium" or "non-transitory computer readable medium" in the disclosure herein.

A fundamental principle of one or more embodiments herein is based on the observation that AGC converges fast if the RX UE knows or can estimate the power of the received power prior to reception of the signal, e.g. arranged in a subframe/slot, and can thereby pre-set the receiver amplification prior to actually receiving the signal. If fast convergence of the AGC algorithm is enabled, the AGC settling period can be reduced, sometimes so much that a dedicated OFDM symbol for the AGC settling period is not required, even when the RX UE is in a fast fading environment.

This is complemented by further embodiments. The idea is to minimize the overhead and/or signal distortion imposed by the dedicated OFDM symbol for the AGC settling period in situations in which the received power cannot be well estimated a priori. According to the present disclosure, the OFDM symbol that is dedicated for use as a AGC settling period uses a higher frequency numerology such that the length or duration of the AGC symbol is shorter in the time domain than that of the payload-carrying symbols. The particular numerology used for the AGC symbol can be predefined in the system information, or adjusted by higher layer configuration or dynamically configured in case of network assisted SL communication.

The above principle is further complemented by further embodiments where a modified transmission format is employed in which the OFDM symbols are reordered, e.g. the dedicated AGC symbol, the sidelink control channel (PSCCH) symbols and the sidelink data channel (PSSCH) symbols. This reordering serves the purpose of reducing the negative impact of slow convergence of the amplifier gain on the control channel by adapting the granularity of the resources used.

The above principle is further complemented by further embodiments employing a specific characteristic of the useful signal design in the AGC symbol. In particular, the transmitted signal within the AGC symbol can be designed to have a certain repetition pattern in the time domain. By knowing the repetition factor of the transmitted signals, and that the AGC settling only affects one of the repeated receiving signal segments, the RX node can discard the segment with potential distortion from the AGC settling and process only the segments that are not impacted by AGC.

Due to the above principle, the AGC settling time can be reduced thereby reducing the need for always employing the AGC symbol. Thereby it reduces the overhead caused by non-payload bearing AGC symbols within a SL transmission duration. It further avoids the distortion of useful signals, e.g. carrying payload within the dedicated AGC symbol within a SL transmission duration.

By using a higher frequency numerology, the overhead caused by the AGC symbol is reduced. I.e. by reducing the size of the OFDM symbol used for AGC settling in the time domain.

By using a modified transmission format, the negative impact of slow convergence of the amplifier gain on the control channel is reduced.

By employing a specific characteristic of the useful signal design in the dedicated AGC symbol, the AGC settling impact on useful signals transmitted in the AGC symbol is reduced.

In other words, the present invention improves the spectral efficiency of sidelink communication by reducing the AGC settling overhead at the physical layer of the sidelink.

In the embodiments described herein, the PSCCH corresponds to the sidelink control channel that carries sidelink control information, and the PSSCH corresponds to the sidelink data channel. Any number of the different embodiments may be combined.

Some of the examples herein are given based on a mini-slot length of 7 symbols. The same methodologies can be applied for a 14-symbol slot length or other lengths that are shorter than 14 symbols.

FIG. 1 shows a wireless communication system 300 according to one or more embodiments of the present disclosure. The wireless communication system 300 may comprise radio nodes or wireless nodes in the form of a first wireless node, e.g. an RX UE, 100, a second wireless node, RX UE 110, and third wireless node 200, e.g. a TX UE. The first wireless node 100 may comprise a communications interface 101, e.g. a transceiver 104, and is configured to configured to transmit and/or receive wireless signals. The second wireless node 110 may comprise a communications interface 111, e.g. a transceiver 104, and is configured to configured to transmit and/or receive wireless signals. The third wireless node 200 may comprise a communications interface 201, e.g. one or more transceivers, and is configured to configured to transmit and/or receive wireless signals, e.g. to transmit or receive on the same or different bandwidths. The transceivers may be configured to transmit or receive on the same or different bandwidths, e.g. to transmit and/or receive on the same or different bandwidths as the other wireless nodes 100, 110.

Any of the first, second and third wireless node 100, 110, 200 may be configured and/or operative to transmit/receive wireless signals WS, $S1_{100}$, $S1_{110}$ to/from the other wireless nodes, e.g. within the total set of radio resources or the transmission BW of the wireless node. The third wireless node 200, the first wireless node 100 and the second wireless node 110 may use any suitable radio access technology RAT, as defined above.

The first and second wireless node 100, 110 may be configured to transmit/receive wireless signals MS, $S1_{100}$, $S1_{110}$ to/from the transmitting wireless node 200. In one example the first wireless node 100 is configured to receive a first wireless signal $S1_{100}$ directed to the first node. In a second example, the second wireless node 110 is configured to receive a first wireless signal $S1_{110}$ directed to the second node. In a further example, the wireless signal $S1_{110}$ and the wireless signal $S1_{110}$ are the same first wireless signal directed to the first and second node 100, 110.

Figure 2:
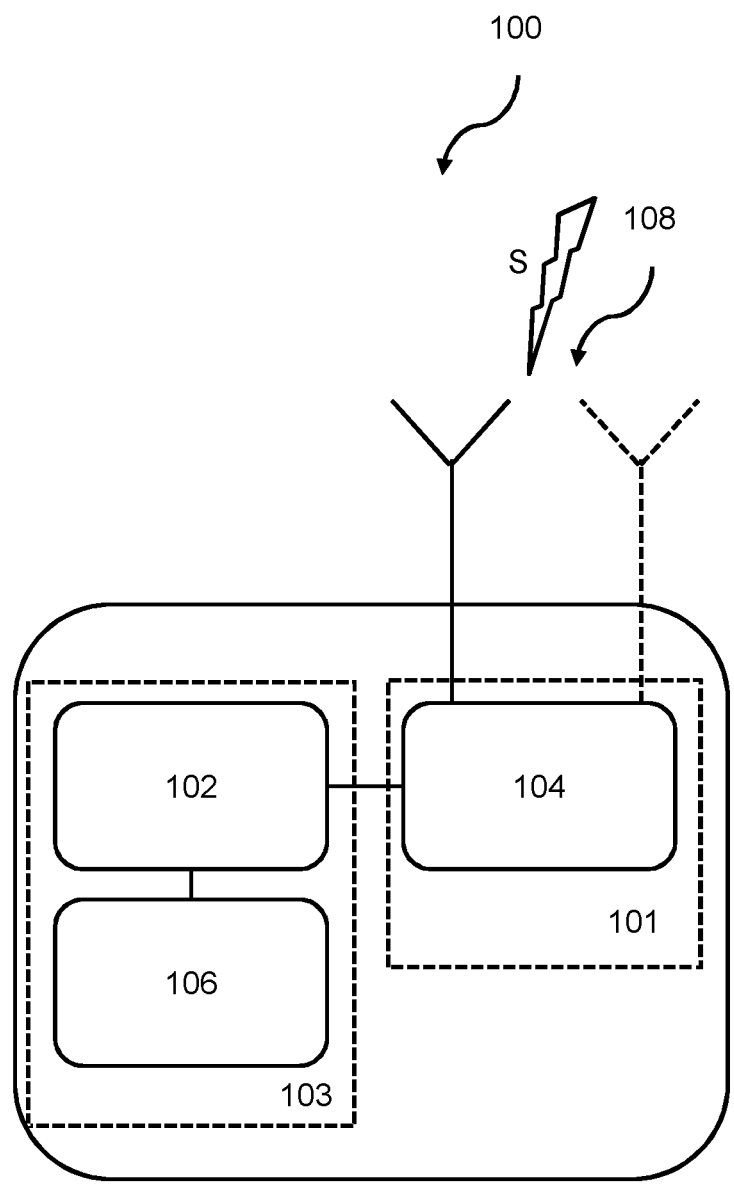
FIG. 2 shows a wireless node configured for communication in a wireless communication system according to one or more embodiments of the present disclosure.

FIG. 2 shows a wireless node 100, 110, 200 configured for communication in a wireless communication system 300 according to one or more embodiments of the present disclosure. The wireless node 100, 110, 200 comprises processing circuitry 103. The processing circuitry 103 may comprise a processor 102, and a memory 106, said memory 106 containing instructions executable by said processor, whereby said wireless node 100 is operative to perform the method of any of the embodiments described herein. The processor 102 is communicatively coupled to a communications interface 101, e.g. comprising one or more transceivers 104. The communications interface 101, 111, 201 may be operative to receive information, such as control information or data information, from the processor 102 and generate a wireless signal S for a wireless communication system or to receive the wireless signal S for a wireless communication system. The communications interface 101, 111, 201 may further be operative to demodulate and/or decode the wireless signal S to control information or data information and send to the processor 102. The wireless signal S may e.g. be any of the wireless signals WS, $S1_{100}$, $S1_{110}$ described further in relation to FIG. 1.

Further, the wireless node 100, 110, 200 may further comprise one or more optional antennas 108, as shown in FIG. 2. The antenna/s 108 is/are coupled to the transceiver/s 104 and is/are configured to transmit/emit or receive wireless signals S for a wireless communication system, e.g. transmit control information or data information included in the wireless signals S. The processor and/or a processor unit 102 may be, e.g. processing circuitry and/or a central processing unit and/or processor modules and/or multiple processors configured to cooperate with each-other. The memory 106 may comprise of essentially any suitable memory, such as a ROM (Read-Only Memory), a PROM (Programmable Read-Only Memory), an EPROM (Erasable PROM), a Flash memory, an EEPROM (Electrically Erasable PROM), or a hard disk drive. The processor 102 may be communicatively coupled to any or all of the transceiver 104 and the memory 106.

An important aspect of the embodiments described herein is based on the observation that AGC of variable gain amplifiers converges faster if the RX UE knows or can estimate the power of the received power prior to reception of the signal, and can thereby pre-set the amplification prior to actually receiving the signal. If fast convergence of the AGC algorithm is enabled, a full dedicated OFDM symbol is not required to allow the AGC to settle, even in a fast fading environment.

According to embodiments of the invention, the TX UE uses a predefined physical channel such as a sidelink control channel (PSCCH) to provide information to the RX UE regarding the employed Tx power. This information the Rx UE can use to predict/anticipate the power of the received multicast, MC, signal on the PSSCH. For instance, a TX UE is scheduled or selects some periodic SL transmissions to a RX UE every second subframes/slots/mini-slots. The Rx UE can utilize the Tx power information received from the PSCCH of the current SL transmission to predict/anticipate the receiving power for the next SL transmission.

Figure 3:
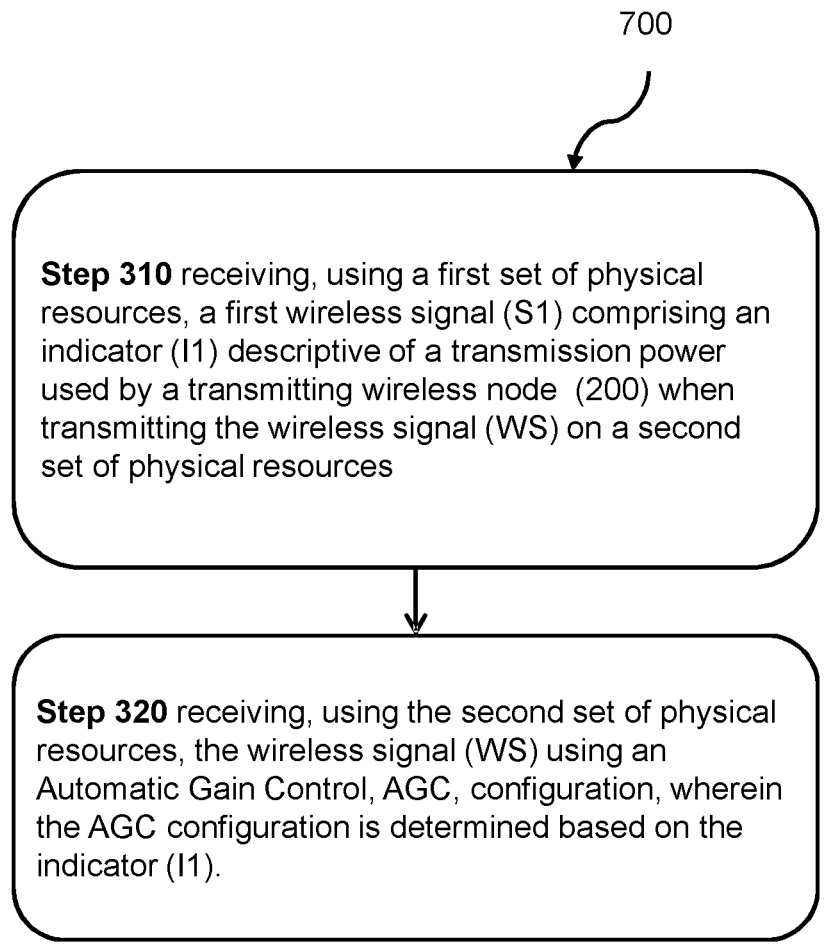
FIG. 3 shows a method for use in a wireless node configured to receive a wireless signal WS according to one or more embodiments of the disclosure.

FIG. 3 shows a method 300 for use in a wireless node 100, 110 configured to receive a wireless signal WS according to one or more embodiments of the disclosure. In one embodiment, the method comprises:

STEP 310: receiving a first signal S1 comprising an indicator I1 descriptive of a transmission power used by a transmitting wireless node 200 when transmitting the wireless signal WS.

In one embodiment, the wireless signal WS is a multicast signal and/or a Device-to-device D2D signal.

In one example the first signal S1 is received as a message received on the PSCCH. In further examples, the first signal S1 is received as cell system information or as high layer signaling.

The indicator I1 may be descriptive of:
absolute Tx power level (e.g. in a quantized form).
relative Tx power level with respect to a predefined absolute transmit power level or with respect to previously signaled absolute power level.
UE position. The Rx UE uses this position information to derive the Tx power level (e.g., using a path loss formula).

The transmission power or transmission power level may be indicative of the transmission power used by a transmitting wireless node 200 when transmitting a subsequent wireless signal WS, e.g. 2-3 or more OFDM symbols later in time.

The wireless signal WS may be a message or packet which is transmitted on the PSSCH, e.g. intended for one or more RX UEs.

In some embodiments, the notification is implicit. For example, if a single data packet is transmitted twice (i.e., initial transmission plus retransmission), the reception of the initial transmission (including the corresponding AGC settlings) is used to pre-set the AGC for the second retransmission. The two transmissions may or may not be consecutive in time.

STEP 320: receiving the wireless signal WS using an Automatic Gain Control, AGC, configuration, wherein the AGC configuration is determined based on the indicator (I1).

In one example, the AGC configuration comprises parameters used by the automatic gain controller AGC to determine the gain of the variable gain power amplifier. Such parameters may include any combination of PSCCH transmit power, receive power and initial gain of the AGC before initiating the AGC algorithm. The AGC algorithm is then executed using the parameters to obtain initial convergence of the amplifier gain.

In one embodiment, the first signal S1 is received using a first set of physical resources and the wireless signal WS is received using a second set of physical resources. In one example, first set of physical resources are resources allocated to a frame or slot on the PSCCH and the second set of physical resources are resources allocated to a following or subsequent frame or slot on the PSCCH.

In one embodiment, the method further comprises determining the AGC configuration based on the indicator I1.

In one embodiment, the method further comprises determining the AGC configuration by predicting a reception power of the wireless node 100 using the indicator I1 and determining the AGC configuration using the predicted reception power.

In one example, a transmitting wireless node 200 is scheduled or selects a set of physical resources for a periodic sidelink transmission to a wireless node 100 in every second subframes/slots/mini-slots. For the cases where the wireless channel between the transmitting wireless node 200 and the receiving wireless node 100 vary slowly, the wireless node 100 can use the indicator I1 received from PSCCH in the current slot to predict the reception power for the next SL transmission(s).

In one embodiment, the AGC configuration is determined by further using a channel estimate of the channel between the transmitting wireless node 200 and the wireless node 100, e.g. channel state information at the receiver, CSIR.

In one example, the Rx UE can advantageously use the indicator I1 together with the estimated channel, e.g. using channel state information at the receiver, CSIR. This mechanism works well in terms of prediction accuracy, when the channel between the TX UE and RX UE has a coherence time that corresponds at least to the time duration of a few (~10) OFDM symbols. Such channel coherence time ensures sufficient time at the receiver to decode the received transmit power level or information and adjust its AGC accordingly. The RX UE continuously updates its CSIR and monitors the PSCCH for the indicator I1 transmitted from the TX UE. The RX UE combines these 2 pieces of information to predict the received power level at least 2-3 or more OFDM symbols ahead of time, assuming that the RX power level can be approximated by the predicted TX power level based on the received indicator I1 or look-ahead information attenuated by the current or predicted channel gain (based on the current or estimated CSIR). Different methods can be used to trigger the transmission of the transmit power recommendation information from the RX UE:

The RX UE may send the recommendation information periodically, where the period is configured by higher layers;

The TX UE may send a request for the recommendation information when the channel condition changes.

In yet another embodiment, the communication network 300 fully controls both the transmission from a TX UE and the reception of a RX UE for a SL communication. The transmit power from the TX UE and the receiving power at the RX UE for the corresponding SL communication are provided by a base station via control information over a downlink control channel, or via high layer signaling.

In some scenarios, e.g., broadcast SL communications, it can be difficult for the RX UEs to know or estimate the received power prior to reception. For some RX UEs, the AGC settling can be done faster such that the AGC duration only occupies partial of a symbol duration.

Figure 4:
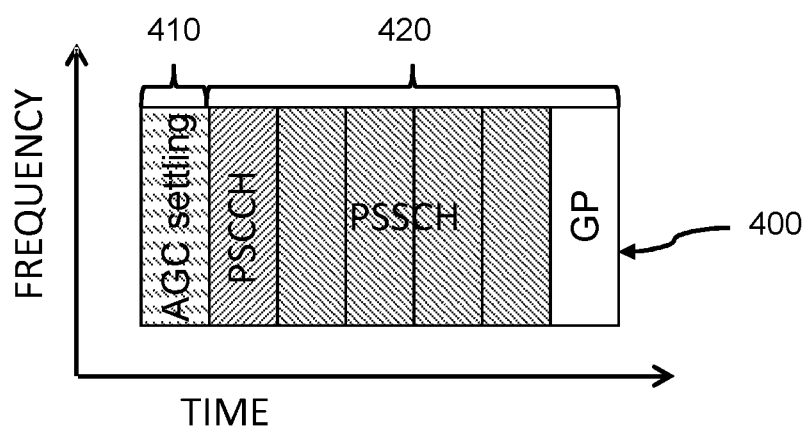
FIG. 4 shows a wireless signal comprising a first set of symbols and a second set of symbols according to one or more embodiments of the present disclosure.

FIG. 4 shows a wireless signal WS comprising a first set of symbols 410 and a second set of symbols 420 according to one or more embodiments of the present disclosure. The first and second set of symbols may be comprised in one or more frames or slots 400, 401. At least part of a duration of at least one of the symbols in the first set is used as an AGC settling period.

In one embodiment, the wireless signal WS comprises a first set of symbols 410 and a second set of symbols 420, wherein at least part of a duration of at least one of the symbols in the first set is used as an AGC settling period.

Figure 5:
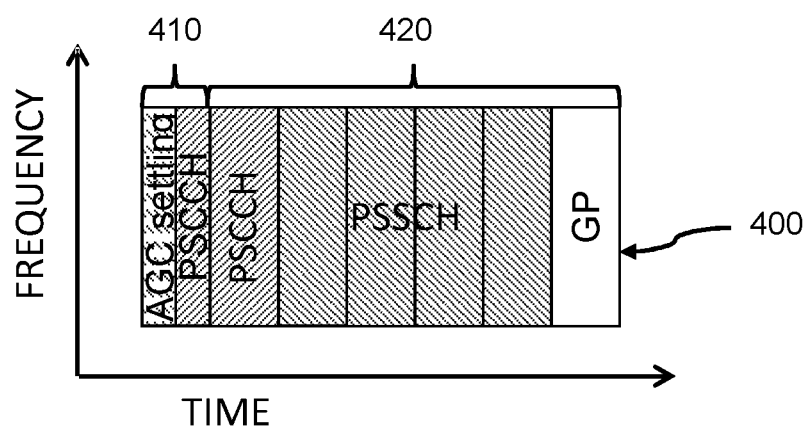
FIG. 5 shows a wireless signal where the symbols comprised in the first set have different numerologies compared to the symbols comprised in the second set according to one or more embodiments of the present disclosure

FIG. 5 shows a wireless signal WS where the symbols comprised in the first set 410 have different numerologies compared to the symbols comprised in the second set 420 according to one or more embodiments of the present disclosure.

In one embodiment, different numerologies (e.g., different subcarrier spacing) are used for the symbols dedicated for AGC settling and the rest of the symbols of a SL transmission. In particular, the AGC symbol(s) have a larger subcarrier spacing (i.e., a shorter symbol duration in time) compared to the rest of the symbols for the SL transmission.

In one or more embodiments, the symbols comprised in the first set 410 have smaller symbol duration than the symbols comprised in the second set 420.

In one example, a SL transmission is configured with a 7-symbol transmission duration and a numerology with a subcarrier spacing of 15 kHz. The AGC settling time needed for a RX UE is around half-symbol duration. To reduce the impact of the AGC settling period, a numerology with a subcarrier spacing of 30 kHz can be used for the AGC symbol such that the first symbol with 15 kHz subcarrier spacing is divided into two shorter symbols with 30 kHz subcarrier spacing. Since the AGC settling time only occupies the first short symbol with 30 kHz subcarrier spacing, the useful data transmission can start from the second short symbol, and thus, will not be impacted by AGC settling.

In one example, the TX UE and RX UE selects (agrees on) a numerology for the dedicated AGC symbol, that can be different from the numerology used for the subsequent (PSCCH or PSSCH) symbols in a frame/slot 400, 401. The TX UE can then use the current PSCCH to indicate the default numerology used for all symbols for the next SL communications. It may also use the PSCCH to indicate the Number of the symbols that the receiver should use as an AGC symbol for the next SL receptions The index of the numerology according to a predefined table that contains the index (1, 2, 3, . . . ) and the corresponding SCS for the next SL communications In another embodiment, the two numerologies used for AGC symbols 410 and non-AGC symbols 420 are pre-configured via cell system information, or semi-dynamically configured via high layer signaling. The numerologies may also be part of a UE pre-configuration to be used when outside network coverage.

In another embodiment, different resource pools can be pre-configured with different mixed numerology pairs. Therefore, the mixed numerology for AGC 410 and non-AGC symbols 420 are implicitly indicated to TX and RX UEs via the resources allocated/selected for the corresponding SL transmissions.

In another embodiment, the OFDM symbols for AGC settling may be also used for PSCCH and/or PSSCH transmission. In this case, the time resources allocated for AGC settling and/or PSCCH/PSSCH transmission are divided into two parts, one part is corresponding to the time resources on the AGC settling OFDM symbols (e.g. the first symbol in 410 in FIG. 5) and the other part is corresponding to the time resources on the non-AGC settling OFDM symbols (e.g. the second symbol in 410 in FIG. 5).

In one embodiment, different encoding may be applied for the first and second part 410, 420. As one example, the encoding bits are first mapped into the second part and then mapped into the first part. When the first part is missing, UE still can decode the PSCCH. As another example, the second part can be taken as the aggregation level 1 and the first part can be taken as the aggregation level 2, the encoding process defined for PDCCH of Uu link can be used here.

In some embodiments, a new transmission format is employed that reduces the impact of imperfect amplifier gain setting (even when an AGC symbol is not used) on the PSSCH.

Figure 6:
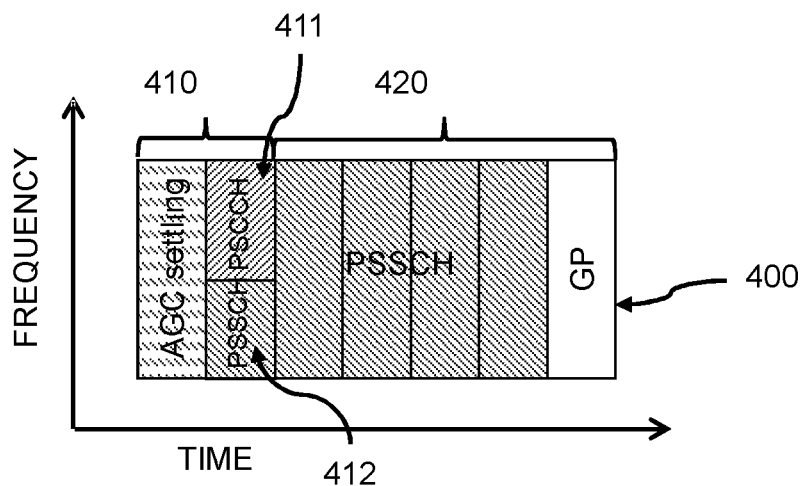
FIG. 6 shows a wireless signal employing a new transmission format according to one or more embodiments of the present disclosure.

FIG. 6 shows the wireless signal WS employing a new transmission format according to one or more embodiments of the present disclosure. In an embodiment, PSCCH is transmitted after parts of PSSCH transmission.

In an embodiment, at least one of the symbols in the first set 410 is split into a first and second set of frequency resources 411, 412.

In an embodiment, the first set of frequency resources 411 may comprises control information comprised in the PSCCH and the second set of frequency resources 412 may comprise data information comprised in the PSSCH or at least one Reference Signal, RS.

With this transmission format, the AGC impact on the control channel can be reduced. For the data channel PSSCH, the first plurality of OFDM symbols can still be used for data transmission. From an RX side, a UE can use them for AGC settling. For some cases, a UE can use them directly for data reception.

In another embodiment, this new transmission format can be combined with other embodiments for the first plurality OFDM symbols transmission, such as using different numerology or the use of specific characteristics as further described below.

In another embodiment, the transmission resources for the PSSCH are divided into two parts, one part is the first plurality of OFDM symbols which are before PSCCH and another part is the second plurality of OFDM symbols which are after PSCCH transmission. Different encoding processes may be applied for these two parts. As one example. In the one part, only parity bits are transmitted. In the another part, both system bits and parity bits are transmitted. With these processing, a UE can use the transmitted bits in the first part based on best efforts. In a further example, we can map the encoded bits firstly in the second part then map in the first part.

In an embodiment, a specific characteristic is defined for the useful signal transmitted in the AGC symbol. By knowing the characteristic (e.g., the repetition factor or comb factor) of the useful signal, as well as the portion of the AGC settling time over the whole SL transmission duration, the RX UE can discard a certain part of the received signal with potential distortion from AGC settling and only process the rest of the received signal. Here, the useful signal can be DMRS, or data, or a combination of DMRS and data.

Figure 7:
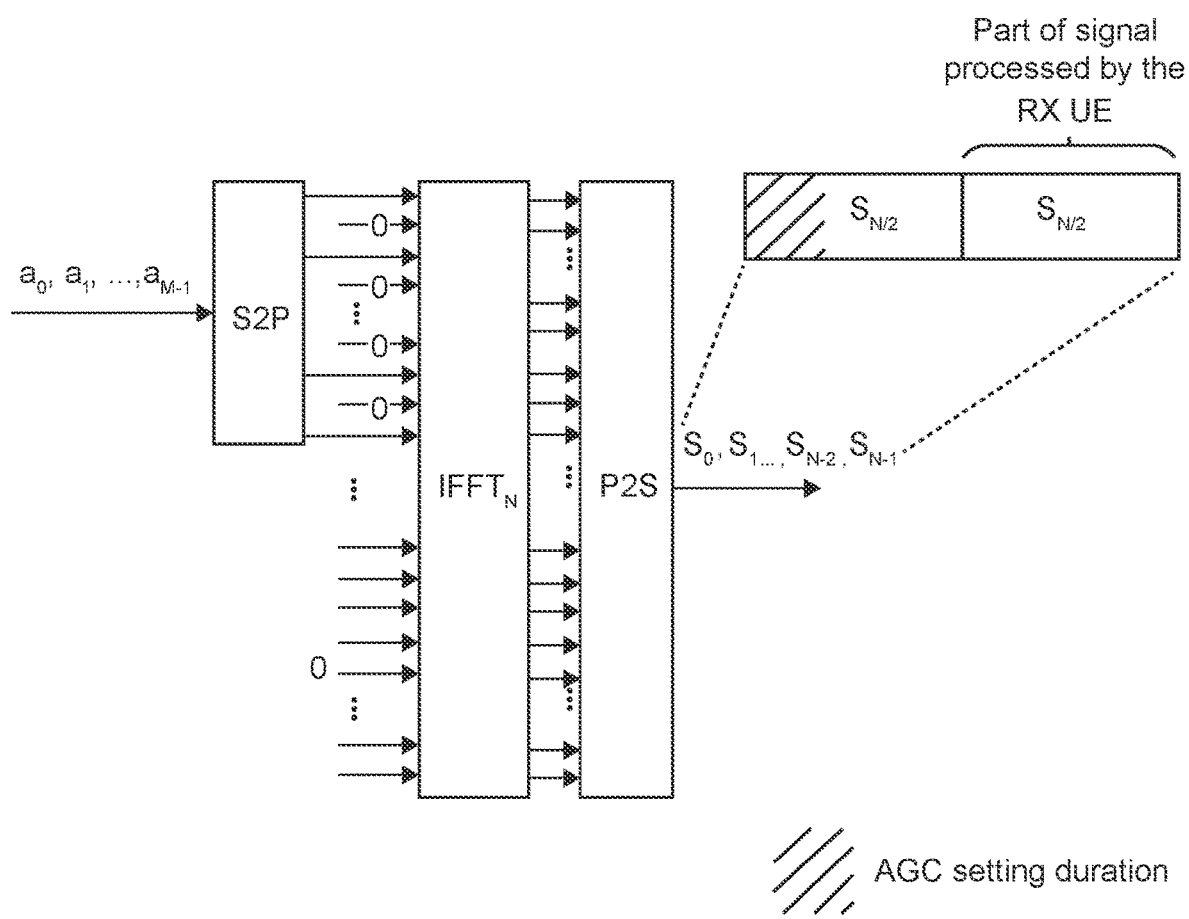
FIG. 7 shows an example of comb-based transmission within in an AGC symbol according to one or more embodiments of the present disclosure.

For example, in the AGC symbol, a comb-based DMRS is transmitted, meaning that in the frequency domain, only every k-th subcarrier is used for transmitting the modulated symbols of the DMRS sequence. In the time domain, this leads to a k times repetition of the same signal. That is, the signals transmitted in the AGC symbol can be divided into k segments, with each segment containing the same useful information, as illustrated in FIG. 7 with k=2. Considering now that the AGC settling time is less than a symbol duration, and the AGC time corresponds to approximately n segments of the repeated signal, then, the RX node can discard the first n segments of the received signal, and only process the rest k-n segments that will not be affected by AGC settling.

FIG. 7 shows an example of comb-based data/DMRS transmission within an AGC symbol according to one or more embodiments of the present disclosure. The repetition factor k=2. Here, a0, a1, . . . , aM−1 are the frequency domain coded and modulated symbols to be transmitted in the AGC symbol duration. The number of allocated subcarriers for the SL transmission is k*M. In addition, s0, s1, . . . , sN−1 are the time domain samples transmitted in the AGC symbol duration. The AGC settling time is assumed to be less than half of the symbol duration.

In further embodiments, a reduction of the overhead due to AGC settling time is achieved by transmitting during a guard period, GP, preceding the actual resources used for the transmission of a message.

A typical example of the slot structure for V2X communication is divided in symbols. Most of these symbols are used for transmission of data and control information. No transmission takes place during the last symbol, which is reserved as guard period.

Figure 8:
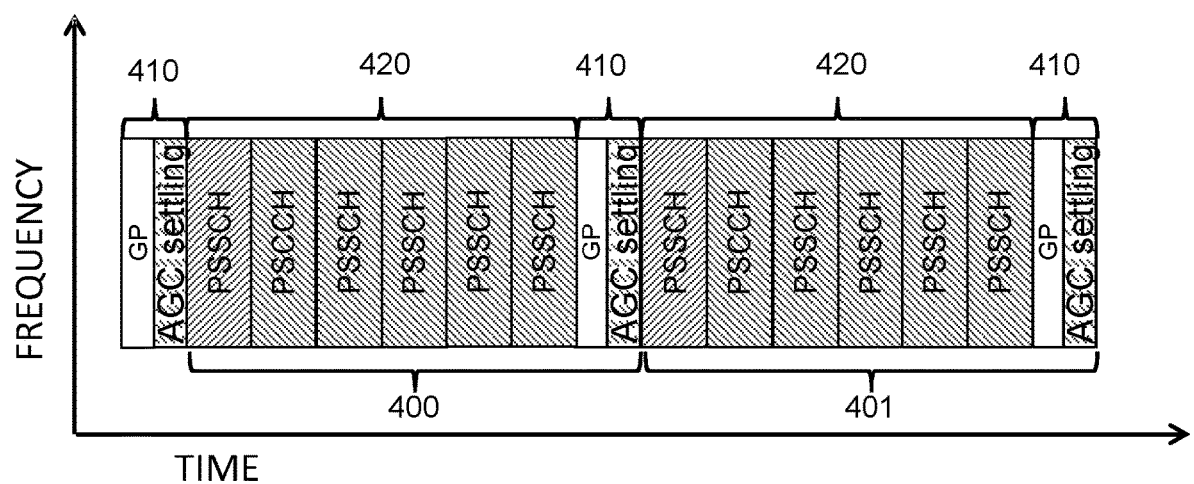
FIG. 8 illustrates how a guard period is used for AGC settling purposes according to one or more embodiments of the present disclosure.

FIG. 8 illustrates how a guard period, GP, is used for AGC settling purposes according to one or more embodiments of the present disclosure. The GP in each slot is divided into two parts: a short GP and AGC settling interval. The transmitter stays silent during the short GP but is active during the AGC settling interval. For example, it may transmit a specific settling signal (e.g., a preamble or training signal) or part of a channel (e.g., control or data channel).

In one embodiment, the first set of symbols 410 are the last symbols in a slot 400 and is in part used as a guard period, wherein at least part of a duration of at least one of the symbols in the first set is 410 used as an AGC settling period for a subsequent slot 401.

It is envisioned that different parts of the GP may be used differently by different users. In an example example involving three wireless nodes, UE1, UE2, UE3:

During slot 400:
UE1 transmits the second set of symbols 420, e.g. control and data channels, followed by an entire GP (i.e., entire last symbol).
UE2 transmits an AGC settling signal during the duration of the first set of symbols 410 comprising the AGC settling interval at the end of the GP, i.e., a partial symbol.

During slot 401:
UE2 transmits the second set of symbols 420, e.g. control and data channels (first symbols), followed by an entire GP (i.e., entire last symbol).
UE3 (or again UE1) transmits an AGC settling signal during the AGC settling interval at the end of the GP (i.e., partial symbol)

In one embodiment, the receiving wireless node 100 further indicates to the transmitting wireless node 200 a transmit power recommendation for the next SL transmissions, e.g., by using a dedicated physical sidelink feedback channel, PSFCH. The transmit power recommendation can be made based on the reception power used for receiving the previous sidelink data transmission from the transmitting wireless node 200, the performance (e.g., block error rate (BLER), throughput) of the previous sidelink data transmission from the transmitting wireless node 200, and/or the CSIR prediction for the wireless channel between the transmitting wireless node 200 and the receiving wireless node 100. The transmit power recommendation can be the same or in the same format as the indicator I1 described above, or a set of transmit power candidates out of which the Tx UE can select one to use for the next transmissions.

In further embodiments, a first wireless node 100, RX UE, receives the second set of symbols 420 from a transmitting third wireless node 200, TX UE, and subsequently transmits feedback using one or more symbols comprised in a third set of symbols 430 to the third wireless node 200. The third wireless node 200 may further use one or more symbols comprised in the third set of symbols 430 as an AGC settling period.

In one embodiment, the slot 400, 401 further comprises a third set of symbols 430 and the method further comprises transmitting feedback in at least one symbol comprised in the third set 430.

Figure 9:
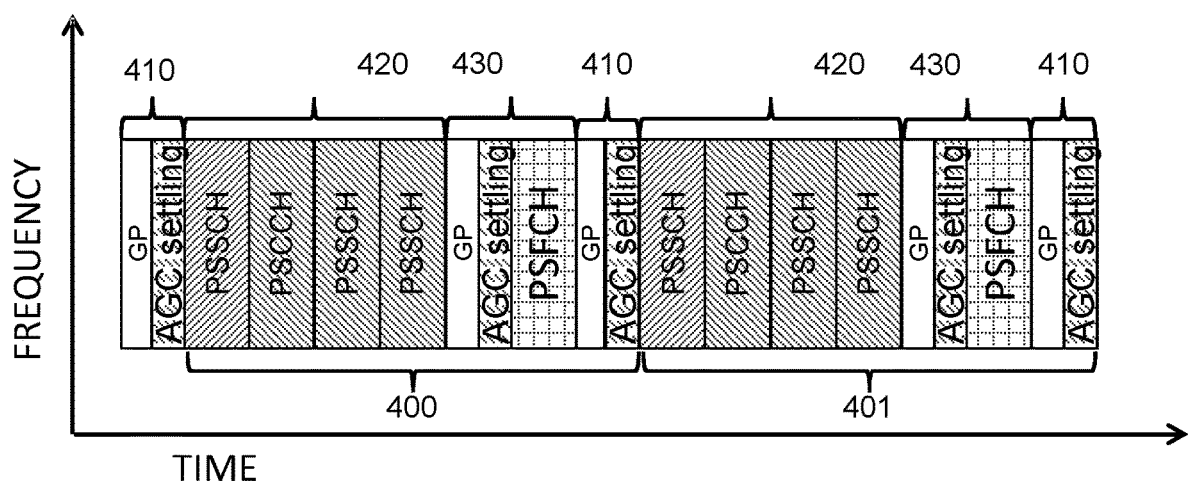
FIG. 9 illustrates multiple guard periods within a slot used for AGC settling purposes according to one or more embodiments of the present disclosure.

FIG. 9 illustrates multiple guard periods within a slot 400, 401 used for AGC settling purposes according to one or more embodiments of the present disclosure. In this case, the slot is divided into the following parts: i) transmission of data channel and control information; ii) first guard period; iii) transmission of feedback channel; and iv) second guard period. Part i) is comprised in the second set of symbols 420. Parts ii) and iii) is comprised in the third set of symbols 430 and part iv) is comprised in the first set of symbols 410.

Each of the first and second guard periods is divided into a short GP and an AGC settling period. Note that the duration of these two GP can be different. For example, the first GP can consist of two symbols, and the second GP can consist of one symbol.

Similarly, different parts of the slot and GP may be used differently by different users. In one example involving four wireless nodes, UE1, UE2, UE3 and UE4 communicating using a first slot 400 and a second slot 401:

During slot 400:
UE1 transmits control and data channels using the second set of symbols 420. UE1 further remains silent during the first GP (the one before PSFCH) comprised in the third set of symbols 430. UE1 further acts as a receiving wireless node for the rest of the first slot 400. UE1 uses the first AGC settling interval (the one before PSFCH) in the first slot 400 to tune its AGC for the reception of the PSFCH.

UE2 receives and processes the transmission by UE1 using the second set of symbols 420. UE2 then transmits an AGC settling signal during the first AGC settling interval comprised in the third set of symbols 430 of the first slot 400, followed by transmission of a feedback channel to UE1. Finally, it remains silent during the second GP comprised in the first set of symbols 410 of the first slot 400, e.g. the entire last symbol.

UE3 transmits an AGC settling signal during the AGC settling interval at the end of the second GP comprised in the first set of symbols 410 of the first slot 400.

During the subsequent or following slot 401:
UE3 transmits control and data channels using the second set of symbols 420. UE3 then remains silent during the first GP comprised in the third set of symbols 430, and acts as a receiving wireless node for the rest of the slot 401, using the first AGC settling interval comprised in the third set of symbols 430 to tune its AGC.

UE4 receives and processes the transmission by UE3 using the second set of symbols 420, transmits during the first AGC settling interval comprised in the third set of symbols 430, followed by transmission of a feedback channel PSFCH to UE3. Finally, it remains silent during the second GP comprised in the first set of symbols 410 of the second slot 401.

UE5 transmits an AGC settling signal during the AGC settling interval at the end of the second GP of the second slot 401.

It is realized that UE1 may coincide with UE3 and/or with UE5. Similarly, UE2 may coincide with UE4.

In further embodiments, the first symbol (entirely or partially) of a slot 400, 401 is used for AGC settling, but use part of the first GP for AGC settling.

Figure 10:
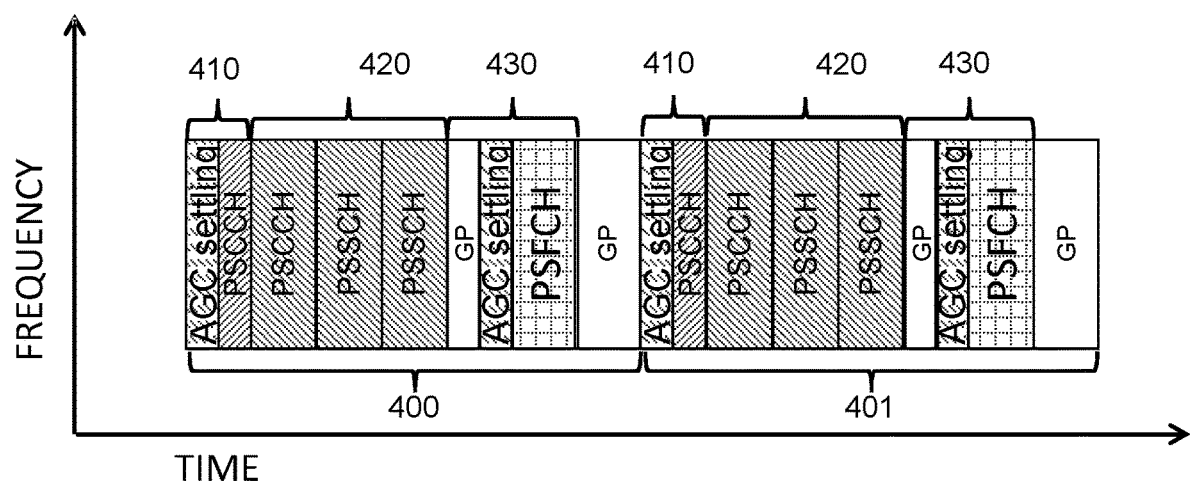
FIG. 10 illustrates a further embodiment of multiple guard periods within a slot according to one or more embodiments of the present disclosure.

FIG. 10 illustrates a further embodiment of multiple guard periods within a slot according to one or more embodiments of the present disclosure.

Comparing to the embodiment shown in FIG. 9, the solution shown in FIG. 10 ensures that the SL transmission is self-contained within a slot. To further reduce the overhead of the second GP, part of the second GP can be used for transmitting the feedback information or reference signals for the feedback channel.

In further embodiments, a method for use in a third wireless node 200 configured to transmit the wireless signal WS is provided (not shown in any figure). The method comprises:

STEP 1110: transmitting the wireless signal WS using a transmission power.

In an embodiment, the method further comprises transmitting a first wireless signal S1 to a receiving first and/or second wireless node 100, 110. The first wireless signal S1 comprises an indicator I1 at least descriptive of the transmission power used by the third wireless node 200.

In an embodiment, the wireless signal WS comprises a plurality of symbols. The symbols may be comprised in one or more frames or slots 400, 401. The one or more frames or slots 400, 401 may comprise a selection of any of a first set of symbols 410, a second set of symbols 420 and a third set of symbols 430.

In one embodiment, the method further comprises:
STEP 1120: receiving feedback in at least one symbol comprised in the third set 430 of symbols. In one embodiment, transmitting 1110 the wireless signal S1 is performed periodically, where the period is configured by network nodes of higher layers.

In one embodiment, transmitting 1110 the wireless signal S1 is performed when the transmit power to be used by a transmitting wireless node 200 for the next transmission changes by at least a predefined threshold with respect to the current Tx power level.

In one embodiment, transmitting 1110 the wireless signal S1 is performed in every sidelink transmission (step 1110) to the Rx UE.

In one embodiment, transmitting 1110 the wireless signal S1 is performed whenever a geographical position of the third wireless node 200 or a receiving wireless node 100, 110 change substantially, e.g., when the third wireless node 200 is moving away from the receiving wireless node 100 such that the distance between them is out of the sidelink communication range that can be supported by using the current transmit power level.

In one embodiment, the method further comprises:
STEP 1130: receiving an indication from a receiving wireless node 100 of a transmit power recommendation for the next SL transmissions by the transmitting wireless node 200. The indication may be the same or similar to the indicator I1 described above. The indication may be received using a dedicated physical sidelink feedback channel, PSFCH.

In an embodiment, a wireless node 100, 110 configured to receive a wireless signal WS, the wireless node 100, 110 comprising:
a communication interface 101 and
processing circuitry 102 configured to cause the wireless node 100, 110 to perform any of the methods described herein.

In an embodiment, a wireless node 200 configured to transmit wireless signal WS, the wireless node 100, 110 comprising:
a communication interface and
processing circuitry configured to cause the wireless node 200 to perform any of the methods described herein.

In an embodiment, a computer program is provided and comprising computer-executable instructions for causing a wireless node or network node, when the computer-executable instructions are executed on circuitry, a processor or a processing unit comprised in the wireless node or network node, to perform any of the method steps described herein. The computer program is included in a computer readable medium of a computer program product. The computer readable medium may comprise of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

In an embodiment, a computer program product comprising a computer-readable storage medium, the computer-readable storage medium having the computer program described above embodied therein.

Moreover, it is realized by the skilled person that the wireless node 100, 110, 200 may comprise the necessary communication capabilities in the form of e.g., functions, means, units, elements, etc., for performing the present solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the present solution.

The processor 102, e.g. of the present wireless node 100, 110, 200 may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

The present disclosure aims to mitigate or reduce the AGC settling impact for SL communications, by helping the Rx UE to know or to estimate in advance the received power level so that a dedicated AGC symbol is not needed. Alternatively, and as a complementing solution, the overhead caused by a dedicated AGC symbol is reduced by employing shortening of the symbol time of the AGC symbol relative to the symbol time of the information carrying symbols, or use part of the GP duration for AGC settling. This solution element can be combined with other methods that exploit the specific characteristics of the signal transmitted in the AGC symbol, to further reduce the impact of the AGC settling for SL communications.

Finally, it should be understood that the disclosure is not limited to the embodiments described above, but also relates to and incorporates all embodiments within the scope of the appended independent claims.

The invention claimed is:

1. A method for use in a wireless node configured to receive a wireless signal (WS), the method comprising:
receiving, using a first set of physical resources, a first wireless signal (S1) comprising an indicator (I1) descriptive of a transmission power used by a second wireless node when transmitting the wireless signal (WS) on a second set of physical resources,
wherein the indicator descriptive of the transmission power comprises an absolute transmission power level, a relative transmission power level with respect to a predefined or previously signaled absolute transmit power level, and a second wireless node position,
wherein the wireless signal (WS) comprises a first set of symbols and a second set of symbols, and
wherein the symbols comprised in the first set have smaller symbol duration than the symbols comprised in the second set; and
receiving, using the second set of physical resources, the wireless signal (WS) using an Automatic Gain Control, AGC, configuration, wherein the AGC configuration is determined based on the indicator (I1),
wherein at least part of a duration of at least one of the symbols in the first set is used as an AGC settling period.

2. The method according to claim 1, wherein the wireless signal (WS) is a multicast signal or a Device-to-device signal.

3. The method according to claim 1, wherein at least one of the symbols is split into a first and second set of frequency resources.

4. The method according to claim 1, wherein the method further comprises utilizing a signal characteristic when decoding information comprised in the first set of symbols.

5. The method according to claim 1, wherein the first set of symbols are the last symbols in a slot and is in part used as a guard period, wherein at least part of a duration of at least one of the symbols in the first set is used as an AGC settling period for a subsequent slot.

6. The method according to claim 1, wherein the wireless signal further comprises a third set of symbols and the method further comprises transmitting feedback in at least one symbol comprised in the third set of symbols.

7. A wireless node configured to receive a wireless signal (WS), the wireless node comprising:
a communication interface and
processing circuitry configured to cause the wireless node to perform a method for use in a wireless node configured to receive a wireless signal (WS), the method comprising:
receiving, using a first set of physical resources, a first wireless signal (S1) comprising an indicator (I1) descriptive of a transmission power used by a second wireless node when transmitting the wireless signal (WS) on a second set of physical resources,
wherein the indicator descriptive of the transmission power comprises an absolute transmission power level, a relative transmission power level with respect to a predefined or previously signaled absolute transmit power level, and a second wireless node position, wherein the wireless signal (WS) comprises a first set of symbols and a second set of symbols, and wherein the symbols comprised in the first set have smaller symbol duration than the symbols comprised in the second set; and receiving, using the second set of physical resources, the wireless signal (WS) using an Automatic Gain Control, AGC, configuration, wherein the AGC configuration is determined based on the indicator (I1), wherein at least part of a duration of at least one of the symbols in the first set is used as an AGC settling period.

8. A non-transitory computer readable medium comprising computer-executable instructions for causing a wireless node, when the computer-executable instructions are executed on processing circuitry comprised in the wireless node, to perform a method for use in a wireless node configured to receive a wireless signal (WS), the method comprising:

receiving, using a first set of physical resources, a first wireless signal (S1) comprising an indicator (I1) descriptive of a transmission power used by a second wireless node when transmitting the wireless signal (WS) on a second set of physical resources, wherein the indicator descriptive of the transmission power comprises an absolute transmission power level, a relative transmission power level with respect to a predefined or previously signaled absolute transmit power level, and a second wireless node position, wherein the wireless signal (WS) comprises a first set of symbols and a second set of symbols, and wherein the symbols comprised in the first set have smaller symbol duration than the symbols comprised in the second set; and receiving, using the second set of physical resources, the wireless signal (WS) using an Automatic Gain Control, AGC, configuration, wherein the AGC configuration is determined based on the indicator (I1), wherein at least part of a duration of at least one of the symbols in the first set is used as an AGC settling period.

\* \* \* \* \*